US008601333B2

(12) United States Patent  
Van Den Eijnden

(10) Patent No.: US 8,601,333 B2  
(45) Date of Patent: Dec. 3, 2013

(54) METHOD OF AND AN ARRANGEMENT FOR TESTING CONNECTIONS ON A PRINTED CIRCUIT BOARD

(75) Inventor: Petrus Marinus Cornelis Maria Van Den Eijnden, Eindhoven (NL)

(73) Assignee: Jtag Technologies B.V., Eindhoven (NL)

( * ) Notice: Subject to any disclaimer, the term of this patent is extended or adjusted under 35 U.S.C. 154(b) by 288 days.

(21) Appl. No.: 12/941,837

(22) Filed: Nov. 8, 2010

(65) Prior Publication Data

US 2011/0113298 A1 May 12, 2011

Related U.S. Application Data

(60) Provisional application No. 61/259,772, filed on Nov. 10, 2009.

(30) Foreign Application Priority Data

Nov. 10, 2009 (NL) ...................................... 1037457

(51) Int. Cl.  
*G01R 31/28* (2006.01)

(52) U.S. Cl.  
USPC .......................................................... 714/727

(58) Field of Classification Search  
USPC .................................. 714/727–736, 742, 824  
See application file for complete search history.

(56) References Cited

U.S. PATENT DOCUMENTS

| | | | | |
|---|---|---|---|---|
| 5,471,481 A | * | 11/1995 | Okumoto et al. | 714/727 |
| 5,491,666 A | * | 2/1996 | Sturges | 365/201 |
| 5,497,378 A | * | 3/1996 | Amini et al. | 714/727 |
| 5,510,704 A | * | 4/1996 | Parker et al. | 324/763.01 |
| 5,819,025 A | * | 10/1998 | Williams | 714/30 |
| 6,243,665 B1 | * | 6/2001 | Nagoya et al. | 703/20 |
| 6,389,565 B2 | * | 5/2002 | Ryan et al. | 714/724 |

(Continued)

FOREIGN PATENT DOCUMENTS

WO 9939218 8/1999

OTHER PUBLICATIONS

Dutch Search Report issued by the Dutch Patent Office for Dutch Application No. 1037457 filed on Nov. 10, 2009 in the name of Van Den Eijnden.

*Primary Examiner* — Nadeem Iqbal  
(74) *Attorney, Agent, or Firm* — Steinfl & Bruno LLP

(57) ABSTRACT

A method of and an arrangement for testing connections on a printed circuit board between boundary-scan compliant circuit terminals of one or more boundary-scan compliant devices mounted at the printed circuit board and comprising a boundary-scan register of boundary-scan cells of the boundary-scan compliant circuit terminals. Under control of an electronic processing unit, boundary-scan properties of the or each boundary-scan compliant device are retrieved, a list comprising boundary-scan compliant circuit terminals is displayed, and a selection of at least a first and second boundary-scan compliant circuit terminal is received. Based on this selection, a boundary-scan cell of a first boundary-scan compliant circuit terminal of a boundary-scan compliant device is operated as a driver and a boundary-scan cell of a second boundary-scan compliant circuit terminal of a boundary-scan compliant device is operated as a sensor. The driver is controlled through data provided to the boundary-scan register. Data sensed by the sensor are latched in the boundary-scan register. The driver and sensor data are analyzed for a connection between the first and the second boundary-scan compliant circuit terminals and the result of the analyses is presented.

19 Claims, 4 Drawing Sheets

(56) References Cited

U.S. PATENT DOCUMENTS

| | | |
|---|---|---|
| 6,634,005 B1 | 10/2003 | Lindsay et al. |
| 6,988,229 B1 * | 1/2006 | Folea, Jr. .................. 714/727 |
| 7,409,612 B2 * | 8/2008 | Van De Logt et al. ...... 714/727 |
| 2005/0240892 A1 * | 10/2005 | Broberg et al. ............. 716/11 |

* cited by examiner

METHOD OF AND AN ARRANGEMENT FOR TESTING CONNECTIONS ON A PRINTED CIRCUIT BOARD

CROSS-REFERENCE TO RELATED APPLICATIONS

The present document is related to and claims benefit from U.S. provisional patent application document entitled "A method of and an arrangement for testing connections on a printed circuit board" Ser. No. 61/259,772 filed on Nov. 10, 2009 and Convention priority from Netherlands patent application 1037457, filed Nov. 10, 2009, both of which are herein incorporated by reference in their entirety.

TECHNICAL FIELD

The present disclosure relates generally to testing and testing arrangements and, more specifically, to the testing of connections on a printed circuit board between circuit terminals of one or more boundary-scan compliant devices.

BACKGROUND OF THE DISCLOSURE

Design engineers, service repair technicians, production engineers, students and the like often require a simple tool for testing connections between circuit terminals or pins of devices mounted on a Printed Circuit Board, PCB. Such connection tests can be performed using well-known multimeters to measure the ohmic resistance between the respective circuit terminals. In the case of a galvanic connection, the measured resistance is near zero ohms. Some of the multimeters even provide an acoustic signal to indicate that there is a galvanic connection between measured terminals.

The present miniaturisation of Integrated Circuits, ICs, and the introduction of Surface Mounted Devices, SMDs, on both sides of a PCB, for example, have made it practically impossible to access the circuit terminals by the test probes of a multimeter or a test bed fixture.

However, also in the design of present PCBs there is a genuine need for testing connections between circuit terminals of circuit components mounted on such PCB, in a simple and reliable manner.

Boundary-Scan Test, BST, technology provides a tool for testing connections between components, such as ICs, mounted on a PCB, without using physical test probes or fixtures. In a boundary-scan compliant device, boundary scan cells connect between the circuit terminals and the electronic circuitry of the device, also called the In Core Logic. The boundary-scan cells can force and/or capture data, i.e. digital signals, at the circuit terminals of the device. The boundary-scan cells of a device are series connected to form a boundary-scan register. Boundary-scan registers of boundary-scan compliant devices at a PCB may be series connected to form a single boundary-scan chain or a plurality of boundary-scan chains.

Test Access Ports, TAP, are provided for shifting data in and out of the boundary-scan register and for applying control signals to present data at an output of a boundary-scan cell, to capture data at an input of a boundary-scan cell, and for shifting data through the boundary-scan register.

Several types of boundary-scan cells can be distinguished:
an input cell;
an output2 cell, having two possible logic output states 0 or 1;
an output3 cell; having three possible logic output states 0, 1 and Z (tri-state);
a Bi-directional cell or Input/Output cell,
a dot 4 cell,
a dot 6 cell, and
a control cell for enabling or disabling the driver of an output3 cell or a bidirectional cell.

A boundary-scan cell operating for capturing data at an associated circuit terminal is also called a sensor and a boundary-scan cell operating for outputting data at an associated circuit terminal of a boundary-scan compliant device is also called a driver.

Boundary-scan test systems are generally comprised of two basic elements: a Test Program Generator, TPG, and the Test Execution, TE. A TPG requires a list describing the connectivity of the PCB, also called net list, and the so-called Boundary-Scan Description Language, BSDL, files of the respective boundary-scan components mounted on the PCB. BSDL enables users to provide a description of the manner in which a particular device is made boundary-scan compliant. The BSDL file is used by the boundary-scan test system to make use of the device features for test program generation and failure diagnosis.

For performing a boundary-scan test, a user has to provide a test plan consisting of various test steps, including the generation of test vectors, i.e. a well defined series of logical 1 en logical 0 bits. Developing such test vectors is time consuming and requires skilled users. Since IC's are getting more and more complex, the test procedures become likewise more complex and take more time to be completed. For a user, looking for a simple and reliable alternative to the above-described multimeter approach for testing connections on a PCB, present regular boundary-scan testing does not provide a genuine alternative.

SUMMARY

According to several embodiments a reliable and easy-to-use method of testing connections on a modern PCB between circuit terminals of boundary-scan compliant devices is provided.

In a first aspect, there is provided a method of testing connections on a printed circuit board between boundary-scan compliant circuit terminals of at least one boundary-scan compliant device mounted at the printed circuit board and comprising a boundary-scan register of boundary-scan cells of the boundary-scan compliant circuit terminals, the method using an electronic processing unit and comprising the steps of:

retrieving, by the processing unit, boundary-scan properties of the at least one boundary-scan compliant device, the boundary-scan properties at least comprising a listing of boundary-scan compliant circuit terminals of the at least one boundary-scan compliant device;

displaying, by the processing unit, a list comprising the boundary-scan compliant circuit terminals of the at least one boundary-scan compliant device;

receiving, by the processing unit, a selection of at least a first and a second boundary-scan compliant circuit terminal of the list;

operating, by the processing unit, a boundary-scan cell of the first boundary-scan compliant circuit terminal as a driver and outputting by the driver data at the first boundary-scan compliant circuit terminal supplied from a boundary-scan register comprising the boundary-scan cell operating as the driver;

operating, by the processing unit, a boundary-scan cell of the second boundary-scan compliant circuit terminal as a sensor for sensing data received at the second boundary-scan compliant circuit terminal and latching data sensed by the sensor into a boundary-scan register comprising the boundary-scan cell operating as the sensor;

analysing, by the processing unit, the boundary-scan register driver and sensor data for a connection between the first and the second boundary-scan compliant circuit terminals, and presenting, by the processing unit, a result of the analysing of the driver and sensor data.

The disclosure is based on the insight that circuit terminals of boundary-scan compliant devices, including a single boundary-scan compliant device, between which a connection has to be tested or measured, are accessible through the corresponding boundary-scan cells connected to these circuit terminals.

In the present description and claims such circuit terminals are also called boundary-scan compliant circuit terminals.

From retrieving boundary-scan properties of the at least one boundary scan compliant device mounted at the PCB, a list comprising boundary-scan compliant circuit terminals of the or each boundary-scan compliant device is displayed. For testing a connection between any of these boundary-scan compliant circuit terminals, at least a first and second boundary-scan compliant circuit terminal is selected from this list and this selection is received by the electronic processing unit. By selectively operating, controlled by the electronic processing unit, the boundary-scan cell of the first boundary-scan compliant circuit terminal as a driver and the boundary-scan cell of the second boundary-scan compliant circuit terminal as a sensor, for outputting data by the driver and sensing received data by the sensor, a possible connection between the first and second boundary-scan compliant circuit terminals can be tested. This test comprises analyzing whether data received at the sensor and latched in the associated boundary-scan register comply with data supplied to the driver from the associated boundary-scan register and outputted at the first circuit terminal. In the case of compliance, the first and second boundary-scan compliant circuit terminals connect at the PCB.

In the most simple embodiment of the present method, it suffices to drive the driver at the first circuit terminal by a logical 1 and a logical 0, and to analyze whether the data captured by the sensor at the second circuit terminal follows the order of the signals applied by the driver. In the affirmative, one may conclude that the first and second circuit terminal are connected.

Different from regular boundary-scan testing, the present method does not require the generation of complicated test vectors for driving circuit terminals nor a complicated analysis of received and captured data at circuit terminals. It will be appreciated that the output value of non-selected boundary-scan compliant circuit terminals operating as driver has to be kept unchanged while driving a selected driver.

The present method can be set up and conducted very quickly, comparable to the measurement of connections between circuit terminals using a multimeter or the like. Note that for conducting the present method, no connectivity list or net list of the PCB is required. After selecting, from the displayed list, the boundary-scan compliant circuit terminals to be tested, the present method can be conducted fully automatically, without the user having to bother about test vectors.

As an advantage over a multimeter measurement, the present method is able to measure both a galvanic connection and a logic connection.

To aid the user even further, in an embodiment, the present method provides an acoustic signal to present the result of the test, such as a signal of a first type in the event of a direct connection, either galvanic or a non-inverted logical connection, a signal of a second type different from the first type in the case of an inverted logical connection, and a signal of a different third type if no connection is detected, for example. As will be appreciated by those skilled in the art, various signalling alternatives are feasible in this acoustic output mode.

As a first test to get an indication whether boundary-scan compliant circuit terminals are active or alive, the boundary-scan registers of boundary-scan compliant devices may be driven in a so-called sample mode, wherein samples of the logic states or logic signal values at circuit terminals are captured and latched in the boundary scan register, during normal PCB operation. By analyzing the samples and if the logic state of a particular circuit terminal does not change at all, this may be a first indication that the respective terminal or terminals is or are not connected, for example.

The boundary-scan properties of a particular boundary-scan compliant device may be retrieved from a library or data bank, such as on-line available from a device manufacturer, for example, either locally or remotely accessible for the electronic processing unit. In particular, a Boundary Scan Description Language, BSDL, file of the or each boundary-scan compliant device mounted at the PCB can be loaded in the processing unit, for displaying the list comprising the boundary-scan compliant circuit terminals, for selecting same and operating a driver and sensor based upon the respective BSDL file.

The BSDL file provides, among others, information about the circuit terminals of a device that are boundary-scan compliant and the types of boundary-scan cells described above, for operating same as a driver or sensor. Further, the BSDL file provides information about the bit position of a respective boundary-scan cell in the boundary-scan register, among others for analyzing purposes. That is, based on the positions of the boundary-scan cells operated as driver and sensor, the driver and sensor data outputted by the boundary-scan register can be compared for the type of connection.

In the case of a plurality of boundary-scan compliant devices mounted on a PCB, prior to the start of a particular measurement, the position of the boundary-scan register of individual boundary-scan compliant devices in a chain of series connected boundary-scan registers of the devices mounted at the PCB has to be known to the processing unit. In a manual embodiment, the processing unit receives this information from user input. From this information and the boundary-scan properties contained in the respective BSDL files, for example, the processing unit can form and shift a correct bit sequence through the chain for operating a selected driver and for analyzing latched data of a selected sensor. In a fully automated version, the processing unit may receive the chain information from a data bank, for example.

To aid a user in the connections measurement, in a further embodiment, a graphical interface device is provided. From this graphical interface device, in a very easy and intuitive manner, not requiring special skilled knowledge, a user may select circuit terminals to be tested from a displayed list of boundary-scan compliant circuit terminals for operation as driver and sensor. This selection may be graphically displayed by the graphical interface device before receiving same by the electronic processing unit for further processing of the connections measurement. The graphical interface device can be even further enhanced in that the activation or operation, i.e. the data outputting by the driver and/or the data sensing by the sensor can be controlled from such graphical interface device. The user may select particular test data to be applied at the driver through the boundary scan register of a respective boundary-scan compliant device. The analysis result may be presented using the graphical interface device.

In further embodiments of the present method, a plurality of boundary-scan cells of a plurality of boundary-scan compliant circuit terminals may be operating as sensor and/or a plurality of boundary-scan cells of a plurality of boundary-scan compliant circuit terminals may be operating as driver. This provides, for example, the possibility to test automatically, sequentially a plurality of connections using the acoustic output mode in a considerable shorter period of time compared to a manual multimeter test. By selecting, for example, one driver and a plurality of sensors, a very simple initial connection test may be employed by analyzing sensor data of the respective sensors. This type of measurement also provides the possibility of testing shorts at the PCB.

Further, by selecting, for example, two drivers and one sensor and activating the drivers to present at their outputs logical signals representing a truth table, the present method is very suitable for measuring logical connections between the driver and sensor, such as a logical AND connection, for example. Those skilled in the art will appreciate that a variety of logic connections may be measured in this way.

Accordingly, in a further embodiment, driver data comprising a truth table are supplied to the boundary-scan register and sensor data latched are analyzed based upon this truth table. It will be appreciated that driver and sensor data in accordance with a plurality of truth tables may be supplied and analyzed for detecting the type of logical connection.

Advantageously, the result of the selection, i.e. receiving, step and/or analyzing step is shown by the graphical user interface device as a circuit diagram representation or the like. This circuit diagram representation can be deducted from additional input information provided by a user making a selection of circuit terminals to be measured and the data received by a selected sensor or sensors, for example.

Boundary scan cells of a boundary-scan compliant device not operating as a driver or sensor may be disabled, if applicable, by setting same in a tri-state Z mode, for example, and/or rendered non-operative by use of a BYPASS instruction to the boundary-scan compliant device, bypassing the complete boundary-scan register of a boundary-scan device that not takes part in the connections measurement. The disabling of boundary-scan cells may be controlled from the graphical user interface, for example. As described above, output3 cells and bidirectional cells may be disabled by a control cell.

In a further aspect, there is provided an arrangement for testing connections on a printed circuit board between boundary-scan compliant circuit terminals of at least one boundary-scan compliant device mounted at the printed circuit board and comprising a boundary-scan register of boundary-scan cells of the boundary-scan compliant circuit terminals, the arrangement comprising an electronic processing unit, wherein the electronic processing unit is arranged for:

retrieving boundary-scan properties of the at least one boundary-scan compliant device, the boundary-scan properties at least comprising a listing of boundary-scan compliant circuit terminals of the at least one boundary-scan compliant device;

displaying a list comprising the boundary-scan compliant circuit terminals of the at least one boundary-scan compliant device;

receiving a selection of at least a first and a second boundary-scan compliant circuit terminal of the list;

operating a boundary-scan cell of the first boundary-scan compliant circuit terminal as a driver and outputting by the driver data at the first boundary-scan compliant circuit terminal supplied from a boundary-scan register comprising the boundary-scan cell operating as the driver;

operating a boundary-scan cell of the second boundary-scan compliant circuit terminal as a sensor for sensing data received at the second boundary-scan compliant circuit terminal and latching data sensed by the sensor into a boundary-scan register comprising the boundary-scan cell operating as the sensor;

analysing the boundary-scan register driver and sensor data for a connection between the first and the second boundary-scan compliant circuit terminals, and presenting a result of the analysing of the driver and sensor data.

In a further embodiment the present arrangement comprises a graphical user interface device operatively connected to the electronic processing unit and/or audio and/or visual signalling unit for presenting the result of the selection, i.e. receiving step and/or analysing step. The arrangement further comprises input means for inputting boundary scan properties of boundary scan compliant devices, such as BSDL files, and for inputting control signals by a user, for example.

The present method may be executed by an electronic processing device through a control interface for controlling the boundary-scan logic. Such control interfaces are known and commercially available from applicant.

To this end, the disclosure also provides a computer program product comprising a computer program having program code data stored on a data carrier and arranged for performing the present method, when said program code data are loaded into a memory of an electronic processing unit or device and are executed by the electronic processing unit.

Advantageously, this computer program product may be comprised by any of a group of data carrying devices including floppy discs, CD-ROMs, DVDs, tapes, memory stick devices, zip drives, flash memory cards, remote access devices, hard disks, semi-conductor memory devices, programmable semi-conductor memory devices, optical disks, magneto-optical data storage devices, ferro electric data storage devices and electrical and optical signal carriers or any other type of data carrier, having the program code data stored thereon.

The above-mentioned and other features and advantages of the disclosure are illustrated in the following description with reference to the enclosed drawings which are provided by way of illustration only and which are not limitative to the present disclosure.

DETAILED DESCRIPTION

Figure 1:
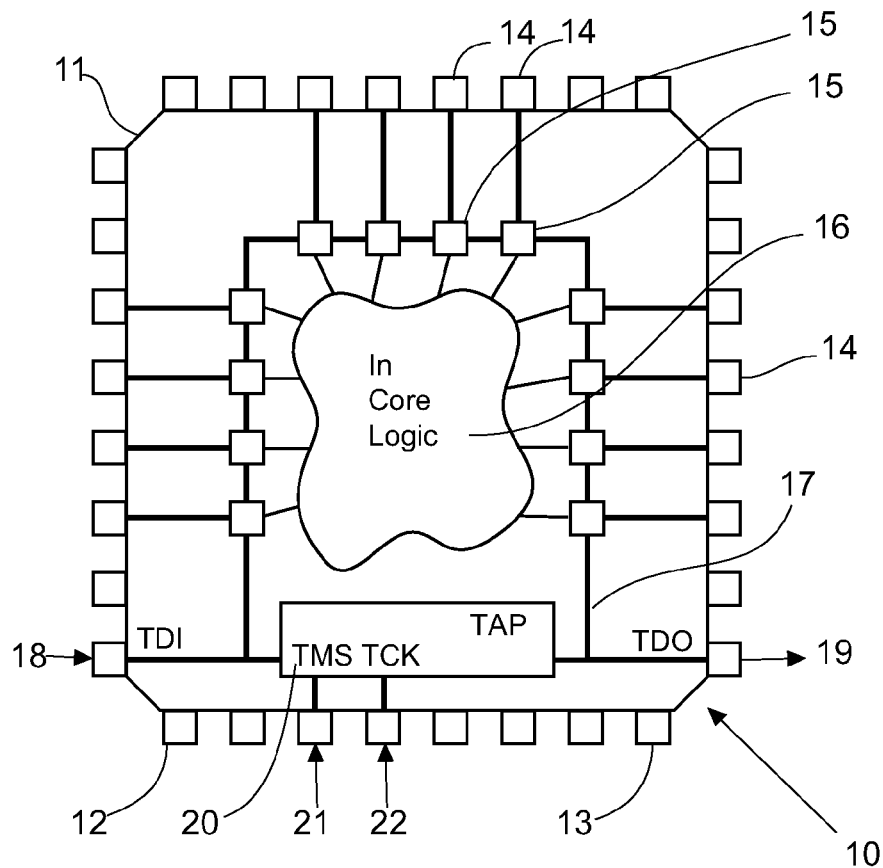
FIG. 1 shows, in a schematic and illustrative manner, a typical prior art boundary-scan compliant electronic device.

FIG. 1 shows an embodiment of a boundary-scan compliant device 10 comprising a housing 11 provided with supply terminals 12, 13 for powering electronic circuitry or In Core Logic 16. The housing 11 comprises a plurality of circuit terminals 14, also called boundary-scan compliant circuit terminals, connected via boundary-scan cells 15 to the In Core Logic 16. In this embodiment the housing 11 is of a typical Surface-Mounted Device, SMD type. The boundary-scan cells 15 together form a boundary-scan register 17 in which data is shifted from a Test Data Input, TDI 18, via the different boundary-scan cells 15, to a Test Data Output, TDO 19. The different boundary-scan parts are controlled by a Test Access Port controller, TAP 20, having at least a Test Mode Select Input, TMS 21, and a Test Clock Input, TCK 22. The TAP controller 20 is controlled in a way well-known to those skilled in the art and defined by boundary-scan standards, such as IEEE STD 1149.1 and higher.

Figure 2:
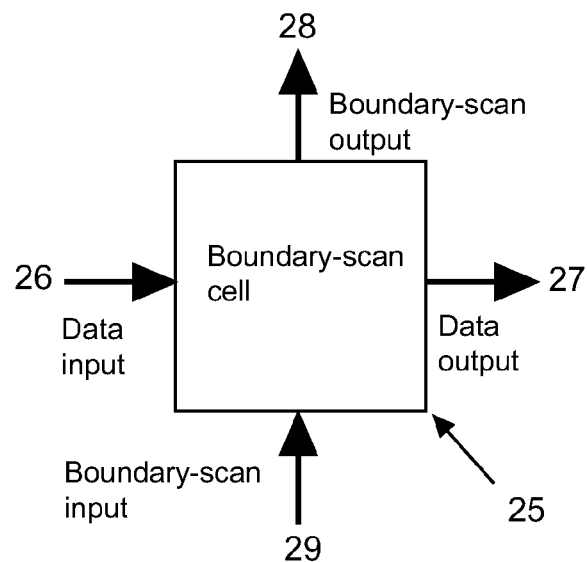
FIG. 2 shows, in a schematic and illustrative manner, a typical prior art boundary-scan cell.

FIG. 2 schematically shows a generalized representation of a boundary-scan cell, BSC, 25, having an input 26 and an output 27. The boundary-scan cell 25 may operate as a sensor for sensing and capturing logic signals at a circuit terminal of the boundary-scan compliant device. To this end the input 26 is connected to a circuit terminal 14, as shown in FIG. 1. The output of the boundary-scan cell 27 then connects to the In Core Logic 16. The boundary-scan cell 25 may also operate as a driver for outputting a logic signal at a circuit terminal of the boundary-scan compliant device. To this end the input 26 is connected to the In Core Logic 16 and the output 27 is connected to a circuit terminal 14.

The boundary-scan cell 25 can either be a permanent driver, a permanent sensor or of a bi-directional type. When being bi-directional, the mode of the boundary-scan cell 25 (i.e. driver or sensor) is controlled from the TAP controller 20 by a boundary-scan cell operating as a control cell (not shown). Capturing data at the input and forcing data at the output of the cell 25 are also controlled from the TAP controller 20, in a standardized manner, as known to the skilled person. Output 28 and input 29 of the boundary-scan cell 25 are register connections for connecting to a corresponding neighbouring boundary-scan cell input 29 and output 28, respectively. Boundary-scan cells series connected in this way form the boundary-scan shift register 17, as shown in FIG. 1.

Figure 3:
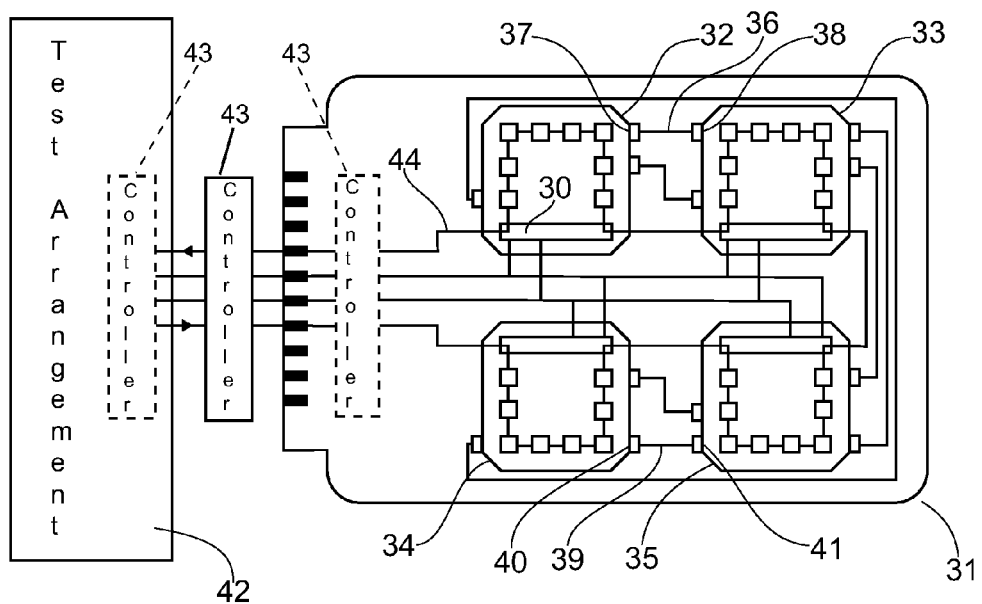
FIG. 3 shows, in a schematic and illustrative manner, a printed circuit board as a device under test connected to a test arrangement for performing a connections measurement according to embodiments of the present disclosure.

FIG. 3 shows an example of a Printed Circuit Board, PCB, 31 with four boundary-scan compliant devices 32, 33, 34, 35. The boundary-scan registers of the devices 32, 33, 34, 35 are series connected and form a boundary-scan chain 44, controlled from a control interface or boundary scan controller 43. The controller 43 is, in general, a control interface device separate from the PCB 31. However, as illustratively shown in broken lines, the controller 43 may also be mounted at the PCB 31. The controller 43 operates the TAP controllers 30 of the boundary-scan compliant devices 32, 33, 34, 35.

FIG. 3 shows several connections on the PCB 31, such as the connections 36, 39 between different boundary-scan compliant circuit terminals 37, 38 and 40, 41, respectively. Although not illustrated, the PCB 31 may also comprise connections between boundary-scan compliant circuit terminals of one and the same boundary-scan compliant device 32, 33, 34, 35. Those skilled in the art will appreciate that in practice a PCB 31 comprises a plurality of connections 36, 39 either direct or galvanic connections and/or logical connections.

Assume a user would like to test connection 36, connecting a first 37 and second 38 boundary-scan compliant circuit terminal of the boundary-scan compliant devices 32, 33 and connection 39, connecting a first 40 and second 41 boundary-scan compliant circuit terminal of boundary-scan compliant devices 34, 35.

Using prior art boundary-scan test methods and equipment, for testing the connections 36, 39 a complex set of test vectors has to be developed, executed and analysed. However, with a test or measurement arrangement 42 according to the present disclosure, the connections can be tested in an intuitive and easy-to-use manner. The arrangement 42, comprising an electronic processing unit or device, operates in conjunction with the controller 43, using standardized boundary-scan control instructions. For the purpose of the present disclosure these control instructions are regarded known to the person skilled in the art of boundary-scan and are not repeated here.

It will be appreciated that the boundary scan controller 43 may also be incorporated in the test arrangement 42, as illustratively shown by broken lines.

Figure 4:
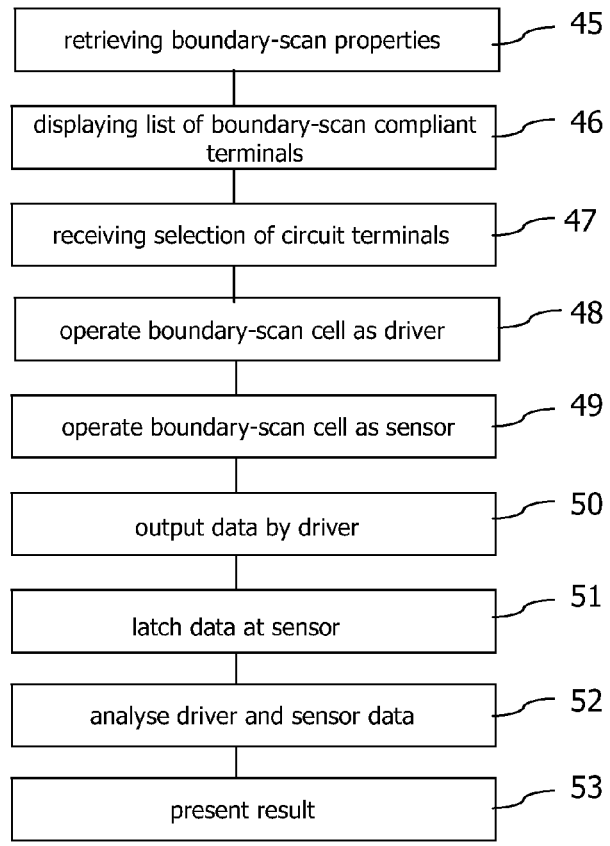
FIG. 4 shows, in a schematic and illustrative manner, a flow chart diagram illustrating the steps of a method in accordance with the present disclosure.

FIG. 4 shows steps of an example embodiment for testing connections on the PCB 31 as shown in FIG. 3 in accordance with an example operating method of the test arrangement 42 according to the present disclosure. For testing the connection 36, in a first step 45, "Retrieving boundary-scan properties", boundary-scan properties of the or each one boundary-scan compliant device mounted at the PCB 31 are retrieved by the electronic processing unit of the test arrangement 42. The properties at least comprise a listing of boundary-scan compliant circuit terminals of the boundary-scan compliant device(s) 32, 33, 34, 35.

The respective properties can be retrieved automatically by the processing unit, based on prior knowledge of a particular PCB 31, i.e. the type or types of boundary-scan compliant devices 32, 33, 34, 35 mounted thereon, or from a manual user input of the several types of boundary-scan compliant devices 32, 33, 34, 35 mounted at the PCB 31. From the type information of the devices, their respective boundary scan properties can be retrieved from a library or data bank, such as on-line available from a device manufacturer, for example, either locally or remotely accessible for the electronic processing unit. In particular, a Boundary Scan Description Language, BSDL, file of the or each boundary-scan compliant device mounted at the PCB can be loaded in the processing unit.

For shifting a suitable bit sequence through the boundary scan registers of the boundary-scan compliant devices 32, 33, 34, 35, the processing unit of the test arrangement 42 has to know the position of the several devices 32, 33, 34, 35 in the chain of series connected boundary-scan registers. Likewise, for analyzing purposes, the processing unit must know the position of latched data of a selected sensor in the chain of series connected boundary-scan registers. This information may be provided manually by a user having knowledge of the PCB 31 or the information may be electronically available from a data bank comprising such information of a particular PCB, for example.

In a second step 46, "Displaying list of boundary-scan devices", a list comprising the boundary-scan compliant circuit terminals of the boundary-scan compliant devices 32, 33, 34, 35 is displayed by the electronic processing unit of the test arrangement 42. The list, among others, comprises the boundary-scan compliant circuit terminals 37, 38, 40, 41.

Next, in step 47, "Receiving selection of circuit terminals", the electronic processing unit of the test arrangement 42 receives a selection of boundary-scan compliant circuit terminals between which a connection is to be tested. In the present example, a first circuit terminal 37 and a second circuit terminal 38. The selection may be made by a user of the test arrangement 42 or by an automated process, for example.

In step 48, "Operate boundary-scan cell as driver", the boundary-scan cell connected to the first circuit terminal 37 of the boundary-scan compliant device 32 of step 47 is operated as a driver by the processing unit of the test arrangement 42. In step 49, "Operate boundary-scan cell as sensor", the boundary-scan cell connected to the second circuit terminal 38 of the boundary scan compliant device 33 of step 47 is operated as a sensor by the processing unit of the test arrangement 42.

The term "operate" is to be construed in that the respective boundary-scan cells are selected to perform the operation of an output or input cell, respectively. If a respective cell is a permanent output cell, then the operating step 48 comprises selection of the respective boundary-scan cell for the purpose of applying data from the boundary-scan register to the circuit terminal associated with the output cell. If a respective cell is a permanent input cell, then the operating step 49 comprises selection of the respective boundary-scan cell for the purpose of latching data from the circuit terminal associated with the input cell into the boundary-scan register. In case the boundary-scan cells are of the bi-directional type, the operating steps 48 and 49 in addition comprise enabling of a cell in the desired mode, i.e. driver or sensor, respectively.

Next, in step 50, "Output data by driver", the driver is controlled for outputting data, forcing a logical signal at the first circuit terminal 37. The data for outputting by the driver are supplied to the respective boundary-scan cell via the boundary-scan register under control of the boundary scan controller 43, the TAP control logic of a particular device and the electronic processing unit of the test arrangement 42. At the next step 51, "Latch data at sensor", data sensed by the sensor at the second circuit terminal 38 is latched in the boundary-scan register at the position determined by the selected sensor boundary-scan cell, under control of the boundary scan controller 43 and the electronic processing unit of the test arrangement 42.

In step 52, "Analyse driver and sensor data", at least the captured data retrieved from the boundary scan-register are analysed by the processing unit of the test arrangement 42, for a connection between driver and sensor. The analysing of the data may be a logical comparison of both driver and sensor data, i.e. at least a logic high value 1 and a logic low value 0. If both data are equal, one may validly conclude that both first 37 and second 38 circuit terminals are connected, either by a direct or galvanic connection 36 or theoretically also by a non-inverting logic connection. If the driver data and the sensor data are inverted, one may conclude that the connection 36 is an inverting connection. If the driver and sensor data are not equal, for example no corresponding data are latched from the sensor, the connection 36 is in error or absent, for example.

For analyzing the data latched by the sensor, each time a driver output signal, i.e. a logic 1 or a logic 0 signal, is provided the boundary-scan register or the boundary-scan chain is completely read and analyzed.

Note that operating a selected cell as driver via the TAP controller of a boundary-scan compliant device may result in operating other cells as driver too. Likewise, operating a selected cell as sensor may result in latching data at other cells operating as sensor. In such a case, the processing unit is arranged to shift a sequence of data bits through the chain of boundary-scan registers such that only the output of the selected driver changes its value, from logic 0 to logic 1 or the other way around, for example. By knowing the bit position of a selected sensor, the processing unit can select the correct values latched by the selected sensor.

Those skilled in the art will appreciate that the bits shifted through the chain of boundary-scan registers may be selected such to keep other non-boundary-scan compliant devices or components mounted at the PCB and in connection with circuit terminals of a particular boundary-scan compliant device, such as buffers or the like, in a safe mode of operation, for example disabled. This to avoid driver conflicts while operating the selected driver or drivers by the processing unit.

Alternatively, to test connections between boundary-scan compliant circuit terminals that connect through a so-called active transparent electrical component or device, such as a buffer or the like, of which the output signal equals the input signal, i.e. there is no alteration of the data by the transparent component or device, the bits shifted through the chain of boundary-scan registers may be selected and set by the processing unit to enable such transparent device. That is, to provide that the driver data of the selected driver is transported or shifted through the transparent device towards the selected sensor.

In a further embodiment, use can be made of a so-called dot 6 boundary-scan cell as driver, operating in a so-called toggle mode, in which a pulse or a pulse train of logical signals is outputted once the driver is triggered by a logic signal in the boundary-scan register of which the respective driver forms part of. By a so-called dot 6 receiver cell, a rising and/or falling signal edge of a respective pulse can be detected, thereby providing the possibility of measuring capacitive connections formed by a capacitor that intentionally connects selected circuit terminals or unintentionally by a defect at the PCB. The series of logic 1 and logic 0 signals outputted in the toggle mode can be set. If the set driver output data are known, the latched sensor data can be analyzed for a connection based on this known driver data. A dot 6 receiver as sensor may operate with a dot 1 driver, for example.

In step 53, "Present result", the results of the analysis are presented by the arrangement 42, showing whether there is a connection 36 or not. The presentation of the result may include a buzz signal, the type which indicates the type of connection or no connection at all. The above test may be fully automated executed by the test arrangement 42, because for a simple connections test in principal no special test vector has to be generated.

Figure 5:
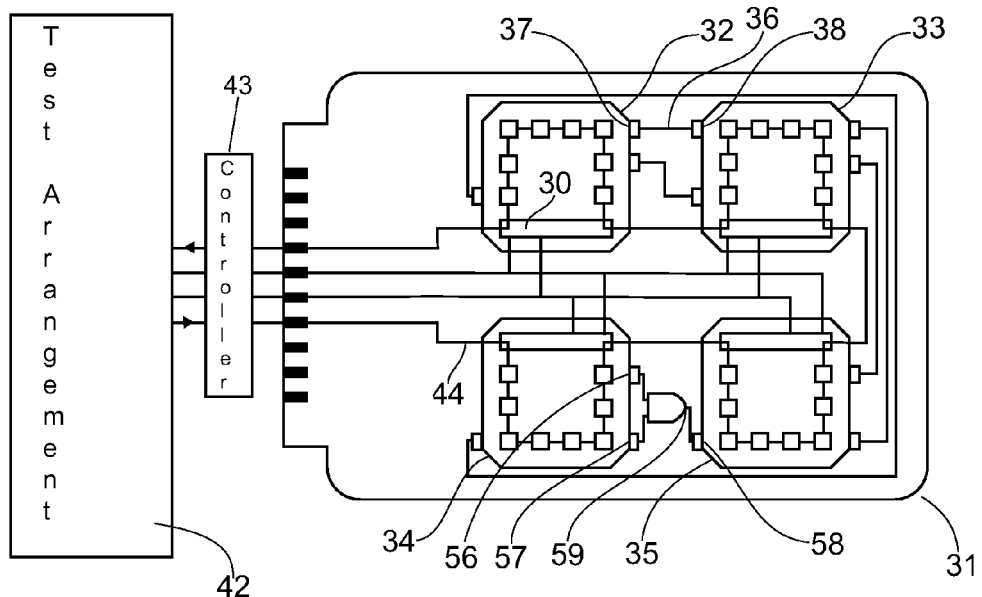
FIG. 5 shows, in a schematic and illustrative manner, a further printed circuit board as a device under test connected to a test arrangement for performing a connections measurement according to embodiments of the present disclosure.

FIG. 5 shows a PCB 55 quite similar to the PCB 31 of FIG. 3, but with a logical connection between three different circuit terminal 56, 57, 58. In this case the logical connection being an AND-port 59. If a user wants to know the type of the logical connection 59, the boundary-scan cells connected to the circuit terminals 56, 57 are operated as driver and the boundary scan cell connected to the circuit terminal 58 is operated as a sensor.

The driver data are supplied using input data of a truth-table as shown in Table 1. The sensed data at the sensor completes the truth-table, making it possible to decide whether the connection is formed by an OR-port, an AND-port or any other logical circuit. If, for example, the result of the truth-table is like below Table 1, the user may conclude that the logical connection is formed by a AND-port. Other outcomes of the truth-table in table 1 can be compared with the outcome of truth-tables of all types of logical ports or circuits, in order to conclude which type the logical connection belongs to. A user may select several different truth tables as driver data for measuring a particular logic connection.

TABLE 1

| Driver 56 | Driver 57 | Sensor 58 |
|---|---|---|
| 0 | 0 | 0 |
| 0 | 1 | 0 |
| 1 | 0 | 0 |
| 1 | 1 | 1 |

Figure 6:
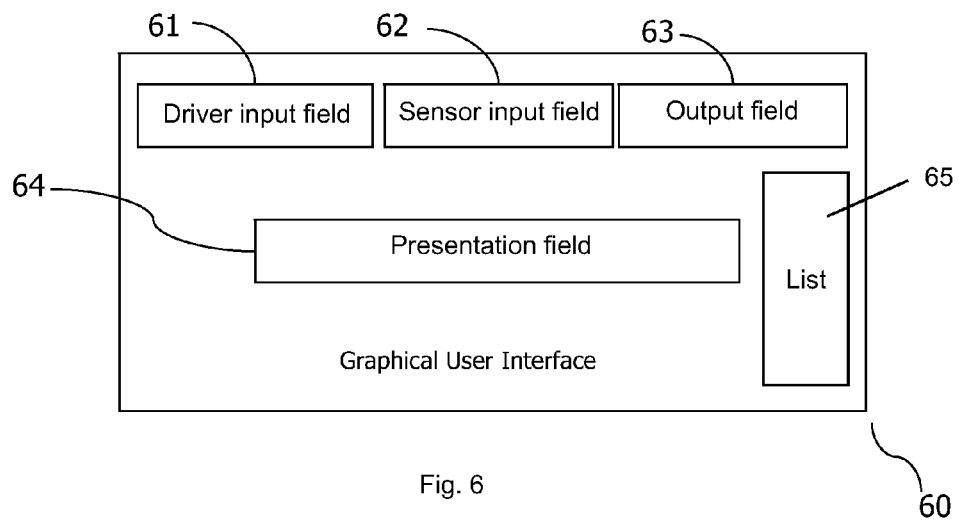
FIG. 6 shows, in a very schematic and illustrative manner, a graphical user interface for use with embodiments of the present disclosure.

In FIG. 6 a Graphical User Interface, GUI, device 60, of the arrangement 42, for example a computer display, is shown. The GUI 60 comprises a first input field 61, for operating, i.e. selecting, from a list 65 comprising boundary-scan compliant circuit terminals of the boundary-scan compliant devices a circuit terminal of a boundary-scan compliant device as a driver, a second input field 62 for operating, i.e. selecting, a circuit terminal of a boundary-scan compliant device as a sensor. If required, in a manual operation, data to be outputted by the driver can be set at field 63. The result of the test is shown within the presentation field 64 and/or acoustically signalled. The result may be displayed in the form of circuit diagram representation.

All selecting and execution of a test or measurement can be done by use of an input device, such as keyboard or mouse operatively connected to the arrangement 42, comprising a digital processing unit, as generally known to the person skilled in the art Boundary scan cells not operating as a driver or sensor may be disabled, if applicable, and if possible without affecting a selected driver or sensor, by setting same in tri-state Z mode, or made non-operative by use of a suitable instruction to the TAP controller of the boundary-scan compliant devices, bypassing the complete boundary-scan register of a boundary-scan device that not takes part in the connections measurement. The disabling of boundary-scan cells may be controlled from the graphical user interface, controlling the TAP controller of the device, for example. As described above, output3 cells and bidirectional cells may be disabled by a control cell.

In particular, information regarding the boundary-scan properties of boundary-scan compliant devices can be retrieved from the Boundary Scan Description Language, BSDL, file of a boundary-scan compliant device mounted at the PCB. The information of the BSDL files is also used for the GUI 60, to visualize the several fields, as discussed.

The disclosure can be performed by a suitable programmed electronic processing unit taking the form of an electronic computer device and a computer program product comprising a computer program in the form of code data stored on a data carrier and arranged for performing the method disclosed, if loaded into a working memory of the electronic processing device.

The computer program product may comprise, but is not limited to, any of a group of data devices including floppy discs, CD-ROMS, DVDs, tapes, memory stick devices, zip drives, flash memory cards, remote access devices, hard disks, semi-conductor memory devices, programmable semiconductor memory devices, optical disks, magneto-optical data storage devices, ferro electric data storage devices, and the like.

Figure 7:
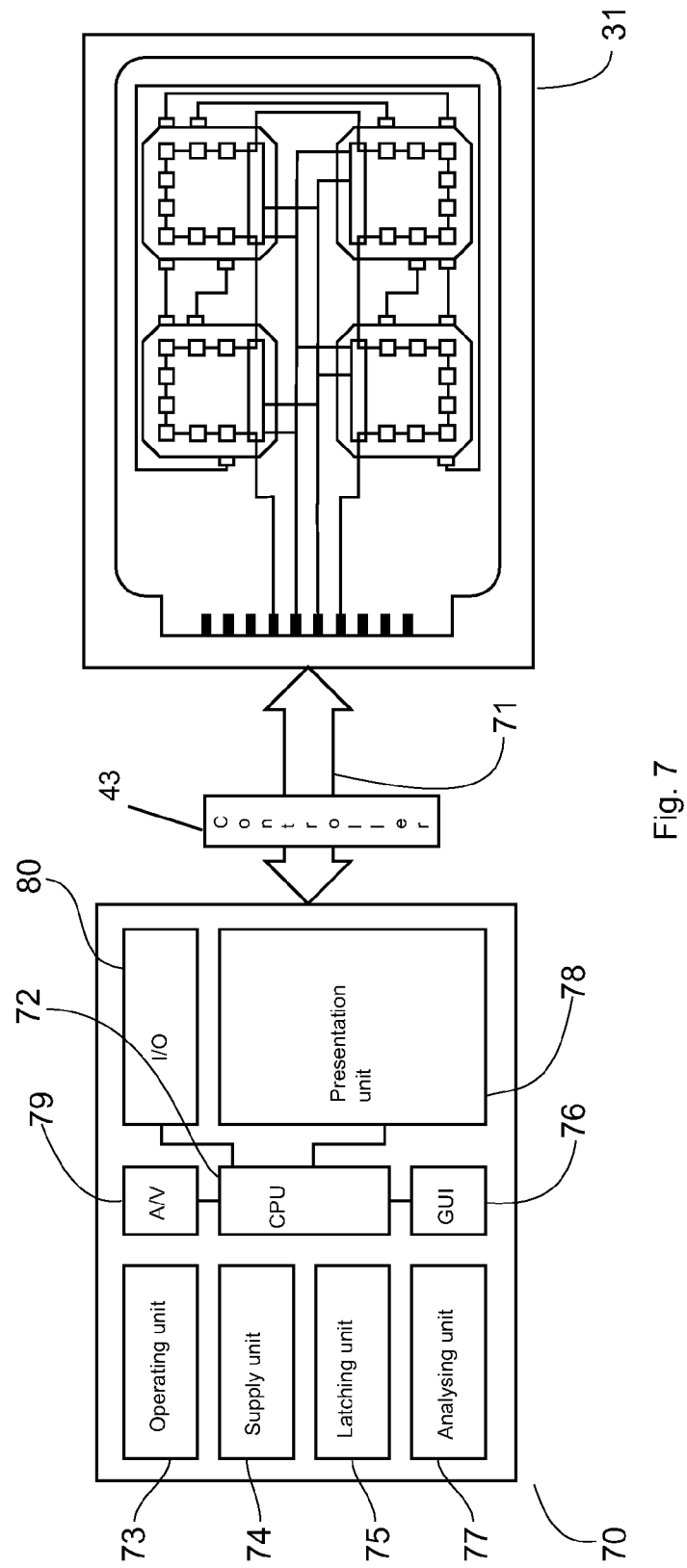
FIG. 7 shows, in a schematic and illustrative manner, an embodiment of a test arrangement for performing a connections measurement according to embodiments of the present disclosure, connected to a printed circuit board.

FIG. 7 shows the PCB 31 connected, for example, by a bus 71 to an arrangement 70 according to the disclosure. The arrangement 70 comprises an electronic Central Processing Unit, CPU, 72 like a computer or micro-processor or the like, operatively connected to an operating unit 73 for operating a boundary-scan cell of a first circuit terminal of a boundary-scan compliant device as a driver and for operating a boundary-scan cell of a second circuit terminal of a boundary-scan compliant device as a sensor. A supply unit 74 for supplying data to the boundary-scan cell operating as the driver. A latching unit 75 for latching data sensed by the sensor. An analysing unit 77 for analysing the driver and sensor data for a connection between the first and second circuit terminals, and a presentation unit 78 for presenting a result of the analysing of the driver and sensor data.

The arrangement 70 further comprises an acoustic signalling unit or audio/visual signalling unit 79, an Input/Output unit 80, among others for loading BSDL files, and Graphical User Interface, GUI, device 76, for presenting measurement or test results and selecting drivers and sensors, in accordance with the embodiments described above.

Modifications and additions to the method and arrangement disclosed above are obvious to those skilled in the art and covered by the scope of the appended claims.

The invention claimed is:

1. A method of testing connections on a printed circuit board between boundary-scan compliant circuit terminals of at least one boundary-scan compliant device mounted at said printed circuit board and comprising a boundary-scan register of boundary-scan cells of said boundary-scan compliant circuit terminals, said method using an electronic processing unit and comprising the steps of:

retrieving, by said processing unit, boundary-scan properties of said at least one boundary-scan compliant device, said boundary-scan properties at least comprising a listing of boundary-scan compliant circuit terminals of said at least one boundary-scan compliant device;

displaying, by said processing unit, a list comprising said boundary-scan compliant circuit terminals of said at least one boundary-scan compliant device;

receiving, by said processing unit, a selection of at least a first and a second boundary-scan compliant circuit terminal of said list;

operating, by said processing unit, a boundary-scan cell of said first boundary-scan compliant circuit terminal as a driver and outputting by said driver data at said first boundary-scan compliant circuit terminal supplied from a boundary-scan register comprising said boundary-scan cell operating as said driver;

operating, by said processing unit, a boundary-scan cell of said second boundary-scan compliant circuit terminal as a sensor for sensing data received at said second boundary-scan compliant circuit terminal and latching data sensed by said sensor into a boundary-scan register comprising said boundary-scan cell operating as said sensor;

analyzing, by said processing unit, said boundary-scan register driver and sensor data for a connection between said first and said second boundary-scan compliant circuit terminals, and presenting, by said processing unit, a result of said analyzing of said driver and sensor data.

2. The method of claim 1, wherein said driver and sensor are operated based upon said retrieved boundary-scan properties, and wherein said step of analyzing comprises comparing said driver and sensor data at positions of said boundary-scan cells of said driver and sensor in said boundary-scan register based upon said retrieved boundary-scan properties.

3. The method of claim 1, wherein said boundary scan properties are retrieved from a Boundary Scan Description Language, BSDL, file of said at least one boundary-scan compliant device.

4. The method of claim 1, further comprising a graphical interface device, wherein at least one of said steps of displaying, receiving, operating and presenting are controlled from said graphical interface device.

5. The method of claim 1, further comprising a graphical interface device, wherein at least one of said steps of receiving and presenting comprise a circuit diagram representation of said boundary-scan register driver and sensor data.

6. The method of claim 1, wherein said result is presented by an acoustic signal.

7. The method of claim 1, wherein a plurality of boundary-scan cells of a plurality of boundary-scan compliant circuit terminals are operated as driver.

8. The method of claim 1, wherein a plurality of boundary-scan cells of a plurality of boundary-scan compliant circuit terminals are operated as sensor.

9. The method of claim 1, wherein a plurality of boundary-scan cells of a plurality of boundary-scan compliant circuit terminals are operated as driver, and wherein said driver data comprises a truth table.

10. The method of claim 1, wherein a plurality of boundary-scan cells of a plurality of boundary-scan compliant circuit terminals are operated as sensor, and wherein said step of analyzing said sensor data is based upon said truth table.

11. The method of claim 1, wherein boundary-scan cells of a boundary-scan compliant device not operated as a driver and a sensor are disabled.

12. The method of claim 1, wherein boundary-scan cells of a boundary-scan compliant device not operated as a driver and a sensor are disabled by use of a BYPASS instruction of said boundary-scan compliant device.

13. An arrangement for testing connections on a printed circuit board between boundary-scan compliant circuit terminals of at least one boundary-scan compliant device mounted at said printed circuit board and comprising a boundary-scan register of boundary-scan cells of said boundary-scan compliant circuit terminals, said arrangement comprising an electronic processing unit, wherein said electronic processing unit is arranged for:

retrieving boundary-scan properties of said at least one boundary-scan compliant device, said boundary-scan properties at least comprising a listing of boundary-scan compliant circuit terminals of said at least one boundary-scan compliant device;

displaying a list comprising said boundary-scan compliant circuit terminals of said at least one boundary-scan compliant device;

receiving a selection of at least a first and a second boundary-scan compliant circuit terminal of said list;

operating a boundary-scan cell of said first boundary-scan compliant circuit terminal as a driver and outputting by said driver data at said first boundary-scan compliant circuit terminal supplied from a boundary-scan register comprising said boundary-scan cell operating as said driver;

operating a boundary-scan cell of said second boundary-scan compliant circuit terminal as a sensor for sensing data received at said second boundary-scan compliant circuit terminal and latching data sensed by said sensor into a boundary-scan register comprising said boundary-scan cell operating as said sensor;

analyzing said boundary-scan register driver and sensor data for a connection between said first and said second boundary-scan compliant circuit terminals, and presenting a result of said analyzing of said driver and sensor data.

14. The arrangement of claim 13, further comprising at least one of a graphical user interface device, an audio signalling unit and a visual signalling unit, operatively connected to said electronic processing unit.

15. A computer program product comprising a data storage device storing thereon computer program code data arranged for performing the method of claim 1, when said program code data are loaded into a memory of an electronic processing unit and are executed by said electronic processing unit.

16. The method of claim 2, wherein the comparing being performed between the driver and sensor data is a logical comparison.

17. The method of claim 1, wherein the method is fully automated.

18. The method of claim 14, wherein the graphical user interface device comprises a first and second input field for selecting one or more circuit terminals of a boundary-scan compliant device as a driver or sensor.

19. The method of claim 1, wherein said result is presented as a circuit diagram.

* * * * *